Figure 1:
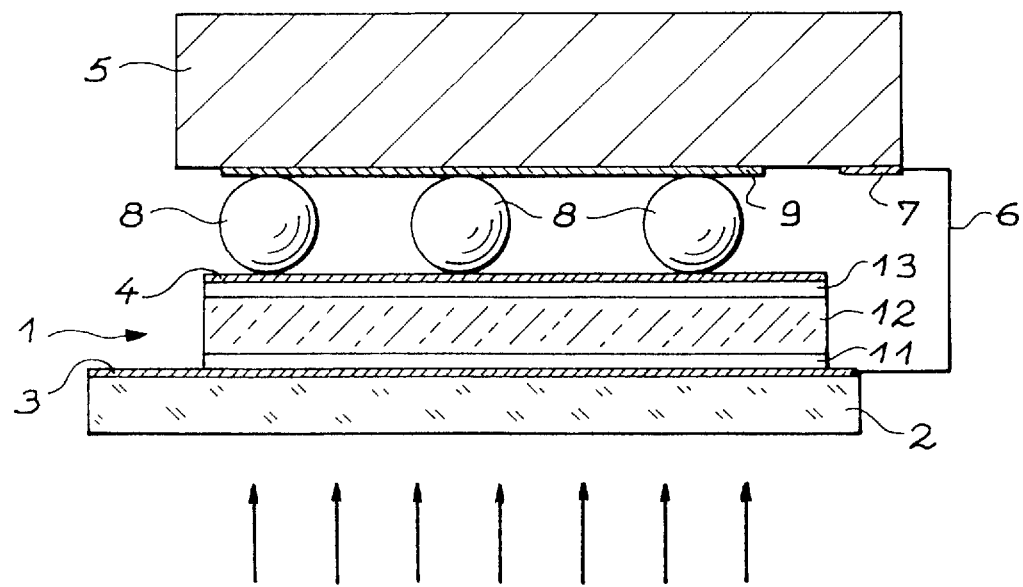

US005844292A

United States Patent
Thierry

[11] Patent Number: 5,844,292
[45] Date of Patent: *Dec. 1, 1998

[54] PHOTOSENSITIVE STRUCTURE HARDENED TO HARD ELECTROMAGNETIC RADIATION AND ITS APPLICATION TO VIDEO CAMERAS

[75] Inventor: Pochet Thierry, Bonnelles, France

[73] Assignee: Commissariat A l'energie Atomique, France

[ * ] Notice: This patent issued on a continued prosecution application filed under 37 CFR 1.53(d), and is subject to the twenty year patent term provisions of 35 U.S.C. 154(a)(2).

[21] Appl. No.: 679,467

[22] Filed: Jul. 15, 1996

[30] Foreign Application Priority Data

Jul. 21, 1995 [FR] France .................................. 95 08881

[51] Int. Cl.$^6$ ...................... H01L 31/075; H01L 31/105; H01L 31/117
[52] U.S. Cl. ......................... 257/458; 257/686; 257/738; 438/57
[58] Field of Search .................................. 257/458, 686, 257/738, 660; 438/57

[56] References Cited

U.S. PATENT DOCUMENTS

| 4,892,594 | 1/1990 | Fujiwara et al. | 136/258 |
|---|---|---|---|
| 4,937,454 | 6/1990 | Itoh et al. | 250/370.11 |
| 5,017,828 | 5/1991 | Takeshi et al. | 313/367 |
| 5,131,584 | 7/1992 | Boitel et al. | 228/180.2 |
| 5,654,590 | 8/1997 | Kuramochi | 257/778 |

FOREIGN PATENT DOCUMENTS

| 0229397 | 7/1987 | European Pat. Off. | H01L 31/18 |
|---|---|---|---|
| 4209842 | 3/1992 | Germany | H01L 27/146 |

OTHER PUBLICATIONS

S. Wolf and R.N. Tauber, "Silicon Processing for the VLSI Era," vol. 1 —Process Technology, p. 38.
Patent Abstracts of Japan, vol. 009, No. 315 (E–365), 11 Dec. 1985 & JP–A–60 148176 (Hitachi Maxwell KK), 5 Aug. 1985.
Patent Abstracts of Japan, vol. 10, No. 240 (E–429), 19 Aug. 1986 & JP–A–60 073323 (Chishiyu Kin), 15 Apr. 1986.

Primary Examiner—Mahshid D. Saadat
Assistant Examiner—Allan R. Wilson
Attorney, Agent, or Firm—Hayes, Soloway, Hennessey, Grossman & Hage, P.C.

[57] ABSTRACT

A photosensitive device, e.g. for use as an optical sensor for a video camera, is designed to capture light and to deliver an electrical signal representative of the captured light, and presenting a resistance to hard electromagnetic radiation. The device includes a photosensitive element in hydrogenated amorphous silicon and a collector for the electrical charges induced by the photoelectric effect in the photosensitive element capturing the light and for delivering an electrical signal resulting therefrom. The device is electrically connected to an electronic processor for processing the electrical signal.

9 Claims, 2 Drawing Sheets

PHOTOSENSITIVE STRUCTURE HARDENED TO HARD ELECTROMAGNETIC RADIATION AND ITS APPLICATION TO VIDEO CAMERAS

This invention relates to a photosensitive structure presenting a resistance to hard electromagnetic radiation. It also relates to a photosensitive device associating such structure to electronic processing circuits of the electrical signal delivered by this structure. The invention notably applies to the fabrication of video cameras resisting to hard electromagnetic radiation in particular, and more generally, to nuclear radiation.

Industries working in extremely hostile environments as far as nuclear radiation is concerned use remote environment perception systems due to the contamination of this environment or because of the presence of ionizing radiation rendering direct human intervention dangerous. Systems used include video cameras functioning in the visible domain and permitting the surveillance of premises or the control of industrial processes.

The camera system has to meet certain requirements specific to the environment for which it is designed. Essentially, there are two such requirements. The camera system must be able to absorb a dose of at least 10 Mrad. It must be operational and give an image with low noise under a dose rate of 100 KRad/h.

At the present time, camera systems capable of satisfying these requirements use Vidicon tubes. These tubes are based on an obsolescent technology which is bound to disappear in the medium term. For a long time much thought has been given to replacement solutions. However, in spite of the considerable sums of money invested in finding a way round this problem, no study has so far given rise to a satisfactory result.

Solutions based on standard video cameras of the charge-coupled device type (CCD), though attractive, cannot be implemented because the CCDs are elaborated from a substrate in crystalline silicon, a material whose crystalline quality deteriorates when exposed to ionizing radiation. CCD video cameras, whose sensitive element is a CCD matrix, are therefore not suited to strongly hostile atmospheres in which their lifespan is at best of the order of a few KRads.

With a view to remedying these disadvantages, this invention provides the use of a photosensitive layer in hydrogenated amorphous silicon. The inventor of this invention has observed that this material is much less sensitive to ionizing radiation than crystalline silicon and that it may therefore be advantageously used to constitute photosensitive elements (or retina) of video cameras designed to function in the presence of ionizing radiation. An additional advantage is the low cost of the technology of devices fabricated in hydrogenated amorphous silicon compared to that of devices fabricated in monocrystalline silicon.

The object of the invention is thus a photosensitive structure designed to capture light and to deliver an electrical signal representative of the captured light, the structure presenting a resistance to hard electromagnetic radiation, characterized in that it includes a photosensitive element in hydrogenated amorphous silicon and means for collecting the electrical charges induced by photoelectric effect in said photosensitive element capturing the light and for delivering said electrical signal.

All photosensitive elements in hydrogenated amorphous silicon are suitable for the purpose. For example, the photosensitive element in hydrogenated amorphous silicon may constitute a junction presenting a depleted layer.

The photosensitive element in hydrogenated amorphous silicon may preferably constitute a bipolar junction of the p-i-n type.

In this latter case, with the junction presenting to the light to be captured a succession of p, i and n layers, the thickness of the photosensitive element lies between 0.5 and 2 $\mu$m.

Layer p of the p-i-n type bipolar junction may have a thickness of the order of 10% of the thickness of the photosensitive element. It may be an alloy of silicon and carbon.

The means for collecting the electrical charges and for delivering said electrical signal may comprise an electrode transparent to light deposited on the face of the photosensitive element receiving the light to be captured and an electrode deposited on the other face of the photosensitive element.

A further object of the invention is a photosensitive device characterized in that it comprises at least one photosensitive structure such as described above, connected electrically to electronic processing means for said electrical signal.

This device may contain a plurality of photosensitive structures in order to constitute an optical sensor.

The photosensitive structures may be connected electrically to the electronic processing means by conductive balls.

They may also be deposited directly on the electronic processing means, thereby ensuring the electrical connection between the photosensitive structures and the electronic means of processing.

This photosensitive device may advantageously be used to constitute the optical sensor of a video camera.

Lastly, the invention relates to a process for treating a photosensitive element in hydrogenated amorphous silicon having been submitted to irradiation by hard electromagnetic radiation in order to restitute to said photosensitive element the performances which it possessed prior to irradiation and which had been weakened by said irradiation, characterized in that it consists of heating the photosensitive element.

This treatment may consist of heating the photosensitive element to a temperature of the order of 80° C. for a few hours, typically for 2 hours.

Figure 2:
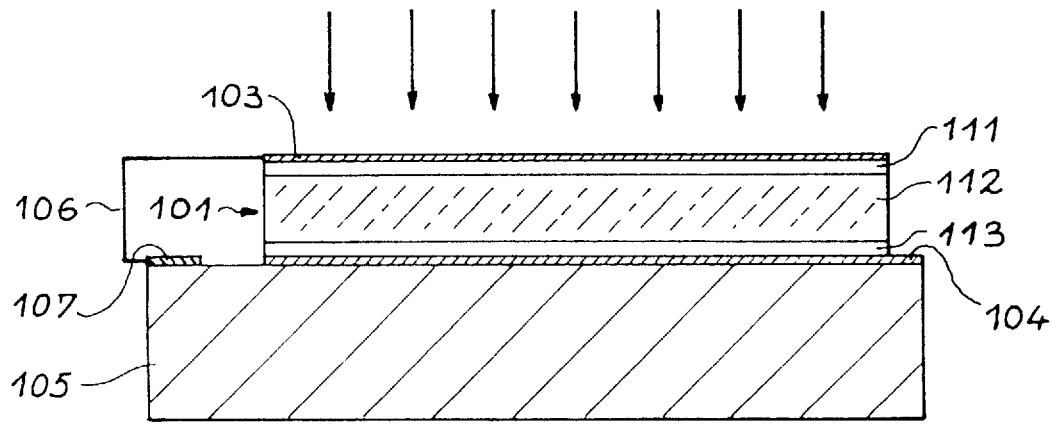
Figure 3A:
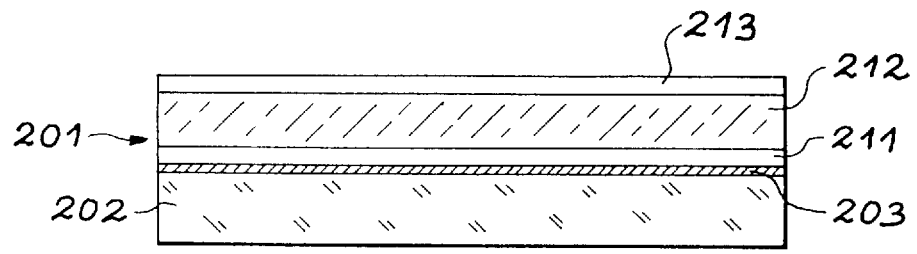
Figure 3B:
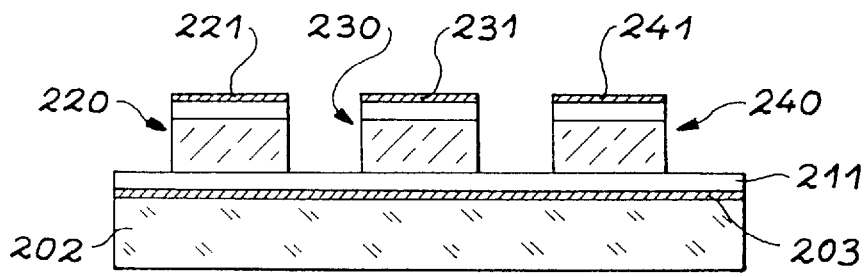
Figure 3C:
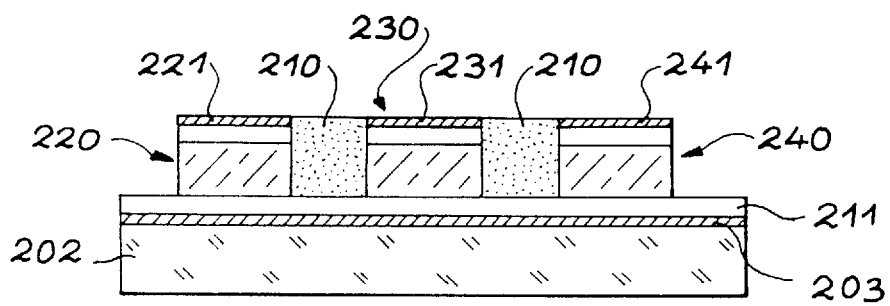

A clearer understanding of the invention, its advantages and special features, will emerge from a reading of the following description which is given as a non-limitative example and is accompanied by drawings in which:

FIG. 1 is a side view of a first variant of a photosensitive device according to the invention, FIG. 2 is a side view of a second variant of a photosensitive device according to the invention, FIGS. 3A, 3B and 3C represent three stages involved in a manufacturing process of a photosensitive device designed to be used as an optical sensor for a video camera.

There now follows a description of the invention with regard to its most significant applications, namely a system for detecting visible light and a video camera.

The photosensitive element in hydrogenated amorphous silicon of the device represented in FIG. 1 is a p-i-n type bipolar junction. The p-i-n junction 1 comprises a layer p marked 11, a layer i marked 12 and a layer n marked 13. The junction 1 is deposited on a transparent support 2 which ensures the mechanical resistance of the unit and the transmission of light. This junction lies between two electrodes: a first electrode 3 which is transparent to light and deposited on the layer 11 (layer p) and thus inserted between the bipolar junction 1 and the support 2, and a second electrode 4 deposited on the layer 13 (layer n). The transparent electrode 3 is, for example, fabricated in tin oxide or a mixed oxide of tin and indium. The electrode 4 is any metallic layer, for example in chromium or aluminum.

The electrodes 3 and 4 make it possible to collect the electrical charges induced by photoelectric effect in the bipolar junction 1 by a light beam (represented by arrows) crossing the transparent support 2 and the transparent electrode 3. An electrical signal is therefore available between the electrodes 3 and 4 and may be processed by an electronic circuit, known to those skilled in the art, in order to give an image, for example on a control screen.

The electrical connection between the electrodes 3 and 4 of the device and the electronic processing circuit 5 may be obtained as follows. A conductive link 6 connects the electrode 3 prolonged on the support 2 to a corresponding input terminal 7 of the electronic circuit 5. Conductive balls 8, for example in indium, electrically connect the electrode 4 to the corresponding input terminal 9 of the processing circuit 5. This interconnection technique is described in document FR-A-2 646 558.

In the variant of the embodiment represented in FIG. 2, the junction 101 comprises, as before, a layer p marked 111, a layer i marked 112 and a layer n marked 113. The layer p is covered with a transparent electrode 103, for example in tin oxide or in a mixed oxide of tin and indium. The electrode 103 allows the passage of an incident light beam symbolized by the arrows. The electrode 104 is a metallic layer constituting an electrical interface between the layer n of the junction 101 and a corresponding input terminal of the processing electronic circuit 105. A conductive link 106 connects the electrode 103 of the junction 101 and a corresponding input terminal 107 of the electronic processing circuit 105. This circuit 105 therefore ensures the mechanical resistance of the unit.

The thickness of the p-i-n type bipolar junction, adapted to the absorption of artificial or natural light, varies from 0.5 $\mu$m to 2 $\mu$m. The surface presented by this junction to an incident light beam may lie between 1 and 2500 $\mu m^2$ depending on the required sensitivity.

The invention is particularly applicable to the fabrication of video cameras. The head of a CCD-type video camera is essentially composed of two parts. One part comprises a set of photosensitive elements (from ten or so to several hundred thousand) whose role is to absorb as much light as possible and to convert the photons into electrons. A second part is made up of the reader matrix which makes it possible to process and then recover the photogenerated charges, image element by image element, for example sequentially, and to carry them towards standard processing electronic means designed to reconstitute the image.

This invention makes it possible to obtain a unit of photosensitive elements hardened to hard electromagnetic radiation and organized in the form of a matrix. This unit of elements may be produced according to a process commonly used in microelectronics, such as illustrated in FIGS. 3A, 3B and 3C. These figures are side views of the device and, for purposes of simplification, show three photosensitive elements only. The unit is of the type shown in FIG. 1, that is to say elaborated from a transparent support. However, the same process may also be applied to a unit of the type shown in FIG. 2.

FIG. 3A shows a transparent support 202 (for example in glass) on which a succession of uniform layers has been deposited: an electrically conductive and transparent layer 203 (for example in a mixed oxide of tin and indium) and three layers of hydrogenated amorphous silicon (a layer p marked 211, a layer i marked 212 and a layer n marked 213).

Using a standard lithographic process (masking), the photosensitive elements are then defined by etching. This is shown in FIG. 3B in which three photosensitive elements 220, 230 and 240 are in the process of elaboration. These photosensitive elements are covered on their layer n by metallic electrodes 221, 231 and 241.

The photosensitive elements may be etched by chemical etching or by plasma. Etching avoids, among other things, surface leakage currents between the image elements. It will be observed that the layer p (or layer 211) has been kept uniform and therefore does not harm the proper functioning of the device.

As shown in FIG. 3C, a passivation phase may now be carried out in order to fill the spaces 210 between the image elements by, for example, silicon oxide $SiO_2$ or silicon nitride $Si_3N_4$.

The hydrogenated amorphous silicon may be deposited using a plasma reactor in which a gas (silane) is dissociated and whose residue (silicon) is deposited on a substrate or support and forms a thin layer of semi-conductive material. If required, the layer p may contain carbon (approximately 10 to 20%) in order to increase the forbidden band and thus limit the absorption of light in this dead zone.

It may be necessary to reverse polarize slightly the p-i-n junctions, between 1 and 10 V depending on the thickness of the device. It will therefore be important to limit the leakage current induced by polarization. This may be achieved by making the p layers relatively thick (of the order of 10% of the thickness of the p-i-n junction).

The material used for producing the photosensitive elements according to the invention is weakly sensitive to ionizing radiation. Measurements have shown that said material makes it possible to remedy the problems of the prior art. As from a dose of 6 MRad, a slight weakening of the leakage current of the device is observed, but this weakening has only a very slight effect on the performances of the photosensitive elements. Moreover, a return to the performances pertaining prior to irradiation is observed when the photosensitive element is submitted to a thermal treatment at low temperature, for example at a temperature of the order of 80° C., for a few hours.

Due to its amorphous structure, the material is much more absorbent to light than crystalline silicon. A layer of 0.5 $\mu$m of hydrogenated amorphous silicon absorbs as much light as 300 $\mu$m of crystalline silicon. This is a particularly useful property inasmuch as material of reduced thickness is much more "transparent" to $\gamma$ rays. As a result, the photosensitive element is far less perturbed by parasitic radiation and may therefore function at high dose rates.

This invention may thus advantageously be applied in the spheres of nuclear industry and space.

We claim:

1. Photosensitive device designed to capture light and deliver an electrical signal representative of the captured light in a video camera, said device presenting resistance to hard electromagnetic radiation, including at least one photosensitive element in hydrogenated amorphous silicon comprising at least one junction presenting a depleted zone, said junction comprising a player in hydrogenated amorphous silicon, said player having a thickness capable of withstanding said hard electromagnetic radiation, and means for collecting electrical charges induced by photoelectric effect in said photosensitive element capturing light and for delivering said electrical signal, wherein means are provided for the reverse polarization of the photosensitive element, wherein the photosensitive element is hydrogenated amorphous silicon constituting a p-i-n type bipolar junction wherein the p-i-n type bipolar junction presenting the succession of layers p, i and n to the light to be captured has a thickness of between 0.5 and 2 μm, and in which the layer p has a thickness greater than about 10% of the thickness of the photosensitive element.

2. Photosensitive device according to claim 1, in which the layer p of the bipolar junction is an alloy of silicon and carbon.

3. Photosensitive device according to claim 1, in which said means for collecting the electrical charges and for delivering said electrical signal comprises an electrode transparent to light deposited on the face of the photosensitive element receiving the light to be captured and an electrode deposited on the other face of the photosensitive element.

4. Photosensitive device according to claim 1, further including electronic means of processing said electrical signal connected electrically to said means for collecting the electrical charges induced.

5. Photosensitive device according to claim 4, including a plurality of photosensitive elements for constituting an optical sensor.

6. Photosensitive device according to claim 5, in which the photosensitive elements are connected elecrically to the electronic processing means by conductive balls.

7. Photosensitive device according to claim 5, in which the photosensitive elements are deposited directly on the electronic processing means, thereby ensuring the electrical connection between the photosensitive elements and the electronic processing means.

8. Photosensitive device according to claim 7, in which the photosensitive elements being p-i-n type bipolar junctions, one of the p or n layers of each of these junctions forms part respectively of a common p or n layer for each junction.

9. Photosensitive device according to claim 8, in which the common layer is a player.

* * * * *

UNITED STATES PATENT AND TRADEMARK OFFICE
CERTIFICATE OF CORRECTION

PATENT NO. : 5,844,292
DATED : December 1, 1998
INVENTOR(S) : Thierry Pochet

It is certified that error appears in the above-identified patent and that said Letters Patent is hereby corrected as shown below:

Claim 1, Col. 4, line 53, insert - -to- - after "and".

Claim 1, Col. 4, line 59, change "player" to - -p layer- -.

Claim 1, Col. 4, line 60, change "player" to - -p layer- -.

Claim 1, Col. 4, line 66, insert - -a- - after "is".

Claim 9, Col. 6, line 18, change "player" to - -p layer- -.

Signed and Sealed this

Seventh Day of December, 1999

Attest:

Q. TODD DICKINSON

*Attesting Officer*  *Acting Commissioner of Patents and Trademarks*

UNITED STATES PATENT AND TRADEMARK OFFICE
CERTIFICATE OF CORRECTION

PATENT NO. : 5,844,292
DATED : December 1, 1998
INVENTOR(S) : Thierry Pochet

It is certified that error appears in the above-identified patent and that said Letters Patent is hereby corrected as shown below:

Claim 1, Col. 5, line 2, insert a - -,- - after "p, i".

Signed and Sealed this

Sixth Day of June, 2000

Attest:

Q. TODD DICKINSON

*Attesting Officer*    *Director of Patents and Trademarks*